United States Patent
Seo et al.

(10) Patent No.: US 10,170,723 B2
(45) Date of Patent: Jan. 1, 2019

(54) ORGANIC LIGHT EMITTING ELEMENT AND ORGANIC LIGHT EMITTING DISPLAY DEVICE INCLUDING THE SAME

(71) Applicant: SAMSUNG DISPLAY CO., LTD., Yongin-si, Gyeonggi-do (KR)

(72) Inventors: Dong Kyu Seo, Hwaseong-si (KR); Dong Chan Kim, Gunpo-si (KR); Won Jong Kim, Suwon-si (KR); Eung Do Kim, Seoul (KR); Jong Hyuk Lee, Seoul (KR); Da Hea Im, Incheon (KR); Sang Hoon Yim, Suwon-si (KR); Yoon Hyeung Cho, Yongin-si (KR); Chang Woong Chu, Hwaseong-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/208,421

(22) Filed: Jul. 12, 2016

(65) Prior Publication Data
US 2017/0125720 A1    May 4, 2017

(30) Foreign Application Priority Data
Oct. 28, 2015 (KR) ............. 10-2015-0150124

(51) Int. Cl.
*H01L 51/52* (2006.01)
*H01L 51/50* (2006.01)
*H01L 27/32* (2006.01)

(52) U.S. Cl.
CPC ...... *H01L 51/5092* (2013.01); *H01L 27/3276* (2013.01); *H01L 51/5056* (2013.01); *H01L 51/5072* (2013.01); *H01L 51/5203* (2013.01); *H01L 51/5231* (2013.01); *H01L 27/3246* (2013.01)

(58) Field of Classification Search
CPC . H01L 51/52; H01L 51/5092; H01L 51/5056; H01L 51/5072; H01L 51/5203
See application file for complete search history.

(56) References Cited

U.S. PATENT DOCUMENTS

| 2003/0038594 A1* | 2/2003 | Seo ...................... H01L 51/5092 313/506 |
| 2007/0035238 A1* | 2/2007 | Nakagawa .......... H01L 51/0064 313/504 |

(Continued)

FOREIGN PATENT DOCUMENTS

| KR | 10-0700658 B1 | 3/2007 |
| KR | 10-2007-0069314 A | 7/2007 |

(Continued)

*Primary Examiner* — Phuc Dang
(74) *Attorney, Agent, or Firm* — Lewis Roca Rothgerber Christie LLP

(57) ABSTRACT

An organic light emitting element according to an exemplary embodiment of the present disclosure includes a first electrode, a second electrode, an emission layer between the first electrode and the second electrode, an electron injection layer between the second electrode and the emission layer, and a barrier layer between the electron injection layer and the second electrode, wherein a work function of the barrier layer is larger than a work function of the second electrode.

18 Claims, 5 Drawing Sheets

(56) References Cited

U.S. PATENT DOCUMENTS

| | | | | |
|---|---|---|---|---|
| 2008/0001529 A1* | 1/2008 | Park | ............. | H01L 51/5088 |
| | | | | 313/504 |
| 2011/0248249 A1* | 10/2011 | Forrest | ............. | H01L 51/5016 |
| | | | | 257/40 |
| 2014/0151658 A1* | 6/2014 | Lee | ............. | H01L 51/5012 |
| | | | | 257/40 |
| 2015/0048299 A1* | 2/2015 | Hwang | ............. | H01L 29/8615 |
| | | | | 257/4 |
| 2015/0255745 A1* | 9/2015 | Zhou | ............. | H01L 51/5092 |
| | | | | 257/40 |
| 2016/0104855 A1* | 4/2016 | Ohsawa | ............. | H01L 51/5012 |
| | | | | 257/40 |
| 2016/0163998 A1* | 6/2016 | Saito | ............. | H01L 51/0072 |
| | | | | 257/40 |
| 2016/0164016 A1* | 6/2016 | Jo | ............. | H01L 51/0007 |
| | | | | 257/40 |
| 2017/0054103 A1* | 2/2017 | Jung | ............. | H01L 51/5072 |

FOREIGN PATENT DOCUMENTS

| | | |
|---|---|---|
| KR | 10-2011-0022566 A | 3/2011 |
| KR | 10-1156429 81 | 6/2012 |

\* cited by examiner

ORGANIC LIGHT EMITTING ELEMENT AND ORGANIC LIGHT EMITTING DISPLAY DEVICE INCLUDING THE SAME

CROSS-REFERENCE TO RELATED APPLICATION

This application claims priority to, and the benefit of, Korean Patent Application No. 10-2015-0150124 filed in the Korean Intellectual Property Office on Oct. 28, 2015, the entire contents of which are incorporated herein by reference.

BACKGROUND

1. Field

Embodiments of the present disclosure relate to an organic light emitting element and an organic light emitting diode display.

2. Description of the Related Art

Recently, because a decrease in weight and thickness of a monitor, a television, etc. is sought after, a cathode ray tube (CRT) has been replaced in the market place by a liquid crystal display (LCD). However, an LCD requires an additional backlight, as the LCD is a passive light emitting device. Also, the LCD has problems in terms of response speed and viewing angle.

As a display device capable of overcoming the aforementioned limitations, an organic light emitting diode display, which is a self-emitting display element having aspects of a wide viewing angle, excellent contrast, and a fast response time, has attracted a great deal of attention.

The organic light emitting diode display includes an organic light emitting element for light emission, and the organic light emitting element forms excitons from combinations, which occur in an emission layer, of electrons, which are injected from one electrode, and holes, which are injected from another electrode, and the excitons emit energy such that light is emitted.

The organic light emitting element emits light by itself without an additional light source, so that it is able to operate with reduced power consumption. Further, the organic light emitting element can improve flexibility of a display device, while reducing the thickness and weight of the display device, and while also improving response speed, viewing angle, and contrast ratio.

The above information disclosed in this Background section is only for enhancement of understanding, and therefore may contain information that does not form the prior art.

SUMMARY

Embodiments of the present disclosure provide an organic light emitting element for increasing light emission efficiency and for increasing lifespan of the organic light emitting element, and an organic light emitting diode display including the same.

An organic light emitting element according to an exemplary embodiment of the present disclosure includes a first electrode, a second electrode, an emission layer between the first electrode and the second electrode, an electron injection layer between the second electrode and the emission layer, and a barrier layer between the electron injection layer and the second electrode, wherein a work function of the barrier layer is larger than a work function of the second electrode.

A work function difference between the barrier layer and the second electrode may be less than or equal to about 1.0 eV.

The barrier layer may include at least one selected from the group consisting of Ag, Al, Fe, In, Ti, Zn, Cr, Mn, Cu, Ga, Zr, Nb, Mo, Sn, Ta, W, Tl, Bi, Pb, and Sb.

The second electrode may include a single Ag layer, or includes Ag and a metal having a work function of less than or equal to about 4.0 eV.

In the second electrode, a ratio of a volume occupied by Ag to a volume occupied by the metal having the work function of less than or equal to about 4.0 eV may be in a range of about 10:1 to about 10:3.

The second electrode may include an AgMg alloy or an AgAl alloy.

The second electrode may include a plurality of layers respectively including the metal having the work function of less than or equal to about 4.0 eV and Ag.

The electron injection layer may include at least one selected from halogen dipole materials based on a Group 1 metal, a Group 2 metal, a transition metal, or a post-transition metal, or at least one selected from oxides based on the Group 1 metal, the Group 2 metal, the transition metal, or the post-transition metal.

A thickness of the barrier layer may be less than or equal to about 5 nm.

The organic light emitting element may further include an electron transport layer between the emission layer and the electron injection layer, and a hole transport layer between the first electrode and the emission layer.

An organic light emitting diode display according to an exemplary embodiment of the present disclosure includes a substrate, a thin film transistor on the substrate, and an organic light emitting element connected to the thin film transistor, and including a first electrode, a second electrode, an emission layer between the first electrode and the second electrode, an electron injection layer between the second electrode and the emission layer, and a barrier layer between the electron injection layer and the second electrode, the barrier layer having a work function that is larger than a work function of the second electrode.

A work function difference between the barrier layer and the second electrode may be less than or equal to about 1.0 eV.

The barrier layer may include at least one selected from the group consisting of Ag, Al, Fe, In, Ti, Zn, Cr, Mn, Cu, Ga, Zr, Nb, Mo, Sn, Ta, W, Tl, Bi, Pb, or Sb.

The second electrode may include a single Ag layer, or Ag and a metal having a work function of less than or equal to about 4.0 eV.

In the second electrode, a ratio of volume occupied by Ag to a volume occupied by the metal having the work function of less than or equal to about 4.0 eV may be in a range of about 10:1 to about 10:3.

The second electrode may include an AgMg alloy or an AgAl alloy.

The second electrode may include a plurality of layers respectively including the metal having the work function of less than or equal to about 4.0 eV and Ag.

The electron injection layer may include at least one selected from halogen dipole materials based on a Group 1 metal, a Group 2 metal, a transition metal, or a post-transition metal, or at least one selected from oxides based on the Group 1 metal, the Group 2 metal, the transition metal, or the post-transition metal._

A thickness of the barrier layer may be less than or equal to about 5 nm.

The organic light emitting diode display may further include an electron transport layer between the emission layer and the electron injection layer, and a hole transport layer between the first electrode and the emission layer.

According to an exemplary embodiment of the present disclosure, the organic light emitting element for increasing emission efficiency and for improving the lifespan thereof, and the organic light emitting diode display including the same, are provided.

DETAILED DESCRIPTION

Figure 1:
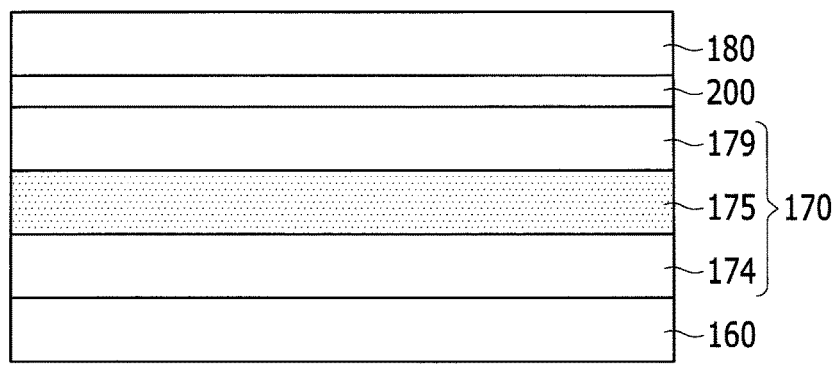
FIG. 1 is a cross-sectional view of an organic light emitting element according to an exemplary embodiment of the present disclosure.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a cross-sectional view of an organic light emitting element according to an exemplary embodiment of the present disclosure. The organic light emitting element of the present embodiment will be described with reference to FIG. 1.

Referring to FIG. 1, the organic light emitting element according to the present embodiment includes a structure in which a first electrode 160, a hole transporting layer 174, an emission layer 175, an electron injection layer 179, a barrier layer 200, and a second electrode 180 are sequentially deposited (e.g., stacked, or layered).

When the first electrode 160 is an anode, the first electrode 160 may be formed by a material having high work function to facilitate a hole injection. The first electrode 160 may be a transparent electrode or a non-transparent electrode. When the first electrode 160 is the transparent electrode, the first electrode 160 may be formed with a thin thickness by using a conductive oxide, such as indium tin oxide (ITO), indium zinc oxide (IZO), tin oxide (SnO2), zinc oxide (ZnO), or combinations thereof, or may be formed of a metal, such as aluminum, silver, and/or magnesium. When the first electrode 160 is the non-transparent electrode, the first electrode 160 may be formed by using the metal, such as aluminum, silver, and/or magnesium.

The first electrode 160 may be formed with a structure of two or more layers including materials of different kinds. For example, the first electrode 160 may be formed of a sequentially stacked structure of indium tin oxide (ITO)/silver (Ag)/indium tin oxide (ITO). The first electrode 160 may be formed by, for example, using a sputtering method or a vacuum deposition method.

The hole transporting layer 174 is on the first electrode 160. The hole transporting layer 174 may perform a function of smoothly transporting the holes transmitted from a hole injection layer, as will be described later. The hole transporting layer 174 may include an organic material. For example, the hole transporting layer 174 may include NPD (N,N-dinaphthyl-N,N'-diphenyl benzidine), TPD (N,N'-bis-(3-methylphenyl)-N,N'-bis-(phenyl)-benzidine), s-TAD (2,2',7,7'-tetrakis(N,N-diphenylamino)-9,9'-spirobifluorene), MTDATA (4,4',4"-tris(N-3-methylphenyl-N-phenylamino)-triphenylamine), etc., although the present invention is not limited thereto.

The thickness of the hole transport layer 174 may be about 15 nm to about 25 nm (e.g., about 20 nm). In the present exemplary embodiment, a hole injection material is included in the hole transport layer 174 as a modification of the hole transport layer 174, and thus, the hole transport/hole injection layers may be formed as a single layer.

The emission layer 175 is on the hole transport layer 174. The emission layer 175 includes an emission material that represents a specific color. For example, the emission layer 175 may display a primary color, or a basic color, such as blue, green, or red, or a combination thereof.

The thickness of the emission layer 175 may be about 10 nm to about 50 nm. The emission layer 175 includes a host and a dopant. The emission layer 175 may include a material that emits red light, green light, blue light, or white light, and may be formed using a phosphorescent or fluorescent material.

When the emission layer 175 is configured to emit red light, the emission layer 175 includes a host material that may include CBP (carbazole biphenyl) or mCP (1,3-bis (carbazol-9-yl), and may be formed of a phosphorescent material including at least one selected from a group consisting of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), and/or PtOEP (octaethylporphyrin platinum), or a fluorescent material including PBD:Eu(DBM)3(Phen) or perylene, although the above are examples, and are not restrictive.

When the emission layer 175 is configured to emit green light, the emission layer 175 may include a host material including CBP or mCP, and may be made of a phosphorescent material including a dopant material including Ir(ppy)3(fac-tris(2-phenylpyridine)iridium) or a fluorescent material including Alq3(tris(8-hydroxyquinolino)aluminum), although the above is not restrictive.

When the emission layer 175 is configured to emit blue light, the emission layer 175 includes a host material including CBP or mCP, and may be made of a phosphorescent material including a dopant that includes (4,6-F2ppy)2Irpic. Alternatively, the emission layer 175 may be made of a fluorescent material including at least one selected from a group consisting of spiro-DPVBi, spiro-6P, DSB (distyrylbenzene), DSA (distyrylarylene), a PFO-based polymer, and/or a PPV-based polymer, although the present invention is not limited thereto.

The electron injection layer 179 is disposed on the emission layer 175. The electron injection layer 179 has a function of improving the electron injection from the second electrode 180 to the emission layer 175.

The electron injection layer 179 according to one embodiment of the present disclosure includes a halogen dipole material based on the metal. The electron injection layer 179 may include a dipole material in which one material selected from a group including F, Cl, Br, and/or I as a halogen element is combined with one material selected from a group including a Group 1 metal, a Group 2 metal, a transition metal, and/or a post-transition metal. Also, the electron injection layer 179 may be a metal oxide based on a material selected from the group including the Group 1 metal, the Group 2 metal, the transition metal, and/or the post-transition metal.

In the organic light emitting element according to the present exemplary embodiment, when the electron injection layer 179 includes the halogen dipole material based on the Group 1 metal, the Group 2 metal, the transition metal, and/or the post-transition metal, or the oxide based on the Group 1 metal, the Group 2 metal, the transition metal, and/or the post-transition metal, an injection barrier is lowered, such that efficiency of the organic light emitting element is increased.

The electron injection layer 179 may be made of a single layer including the halogen dipole material based on the metal, and the oxide based on the metal. However, the present invention is not limited thereto, and the electron injection layer 179 may be formed of a dual-layered structure including the metal and the halogen material based on the metal, or the metal and the oxide. Additionally, the electron injection layer 179 may be formed by using a sputtering method.

The barrier layer 200 is on the electron injection layer 179. The barrier layer 200 of the present embodiment includes a high work function material having higher work function than the second electrode 180, which is described later. Accordingly, an electron injection speed at which the electron is injected from the second electrode 180 to the emission layer 175 through the electron injection layer 179 may be controlled. In other words, the electron injection speed may be slowed due to the barrier layer 200.

Figure 2:
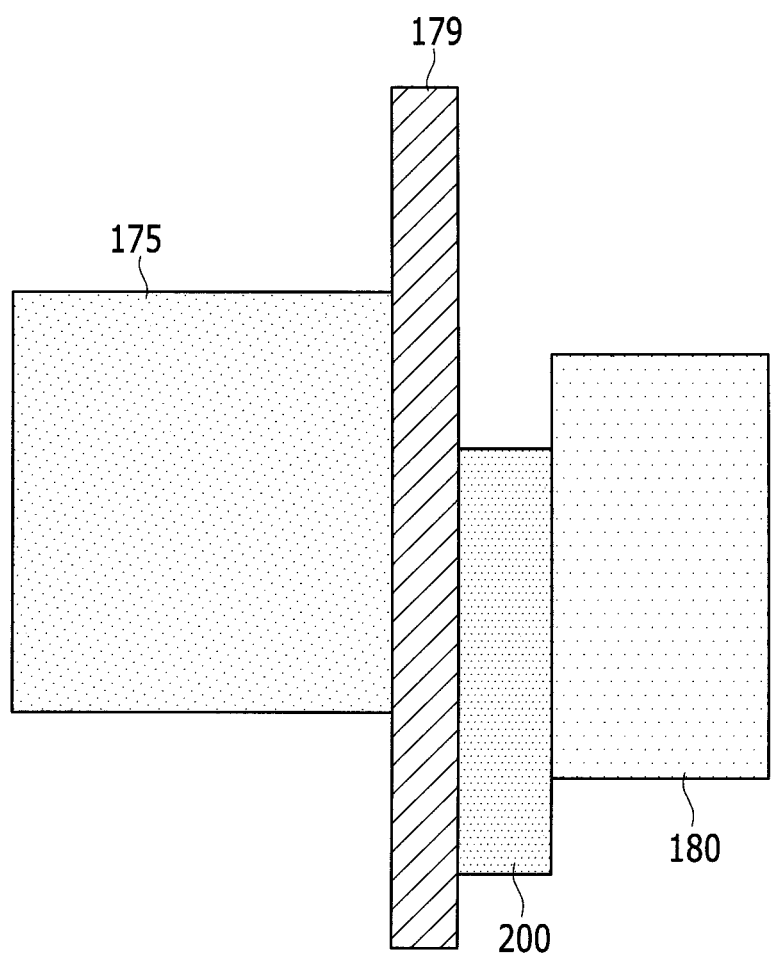
FIG. 2 is a schematic view of an energy level of an organic light emitting element according to an exemplary embodiment of the present disclosure.

FIG. 2 is a schematic view of an energy level of an organic light emitting element according to an exemplary embodiment of the present disclosure. In detail, FIG. 2 depicts an energy level of the emission layer 175, the electron injection layer 179, the barrier layer 200, and the second electrode 180. Referring to FIG. 2, the energy level of the barrier layer 200 is lower than the energy level of the second electrode 180. Accordingly, the energy level difference between the second electrode 180 and the electron injection layer 179 is increased due to the barrier layer 200 that is between the electron injection layer 179 and the second electrode 180 (when compared with a case in which the barrier layer 200 is not formed).

Resultantly, high emission efficiency is maintained due to the electron injection layer 179. Further, the barrier layer 200 formed on the electron injection layer 179 limits the electron (e.g., limits the rate of electrons) injected from the second electrode 180 to the electron injection layer 179, thereby having the effect of extending emission lifespan.

Accordingly, the barrier layer 200 according to the present exemplary embodiment includes the material having the higher work function than the material included in the second electrode 180. In detail, the difference between the work function of the barrier layer 200 and the work function of the material included in the second electrode 180 is less than or equal to about 1.0 eV in the present embodiment. In other embodiments, the difference between the work functions of the barrier layer 200 and the second electrode 180 may be less than or equal to about 0.5 eV. When the work function difference of the barrier layer 200 and the second electrode 180 is over about 1.0 eV, the electron injection barrier from the second electrode 180 to the electron injection layer 179 is increased such that the emission efficiency may be deteriorated, rather than improving the element lifespan, due to the barrier layer 200.

Also, even when the work function difference between the barrier layer 200 and the second electrode 180 according to an exemplary embodiment of the present disclosure is lacking, the electron injection may be effectively controlled by appropriately controlling the thickness of the barrier layer 200.

In detail, the barrier layer 200 according to an exemplary embodiment of the present disclosure includes one selected from a group including silver (Ag), aluminum (Al), iron (Fe), indium (In), titanium (Ti), zinc (Zn), chromium (Cr), manganese (Mn), copper (Cu), gallium (Ga), zirconium (Zr), niobium (Nb), molybdenum (Mo), tin (Sn), tantalum (Ta), tungsten (W), thallium (Tl), bismuth (Bi), lead (Pb), and/or antimony (Sb), and may have a thickness of less than about 10% of the thickness of the second electrode 180. In the present embodiment, the barrier layer 200 may include a single layer of silver (Ag), and the work function of the barrier layer 200 may be about 4.26 eV.

When the thickness of the barrier layer 200 according to an exemplary embodiment of the present disclosure satisfies the above range, the emission efficiency and the lifespan of the element may be maintained by controlling the electron injection speed. The thickness of the barrier layer 200 for obtaining these effects may be less than or equal to about 5 nm.

The second electrode 180 is disposed on the barrier layer 200. When the second electrode 180 is a cathode, the second electrode 180 may include a material having a small work function to facilitate the electron injection. In detail, the second electrode 180 of the present embodiment may be made of a single Ag layer, or may be made of Ag and an alloy including a low work function metal having the work function of less than or equal to about 4.0 eV. The second electrode 180 of the present embodiment may include at least one selected from Ag, Mg, and/or Al. That is, the second electrode 180 may include AgMg and/or an AgAl alloy.

In this case, when forming the second electrode 180 of the alloy including Ag and the metal with a low work function that is less than or equal to about 4.0 eV, the work function of the second electrode 180 may be in a range of about 3.7 eV to about 4.5 eV.

For the alloy of the second electrode 180 including Ag and the low work function metal, when the percentage of Ag is too large, the work function difference with the barrier layer 200 is decreased such that the control effect of the electron injection by the barrier layer 200 is very small. Conversely, when the percentage of Ag is too small, the work function difference with the barrier layer 200 is increased such that the emission efficiency is decreased.

Accordingly, in an exemplary embodiment of the present disclosure, the Ag and the low work function metal having the work function of less than or equal to about 4.0 eV for forming the second electrode 180 is included with a volume ratio (e.g., vol %) of about 10:1 to about 10:3 (e.g., the ratio of the volume of the second electrode 180 occupied by the AG to volume of the second electrode 180 occupied by the low work function metal may be about 10:1 to about 10:3).

That is, by mixing them within the above range, the appropriate work function difference with the barrier layer 200 is maintained such that the conventional emission efficiency may be maintained while extending the element lifespan.

The second electrode 180 according to the present exemplary embodiment may be formed of the single layer by co-depositing Ag and the low work function metal, although the second electrode 180 is not limited thereto, and the second electrode 180 may be made of two layers in other embodiments.

Figure 3:
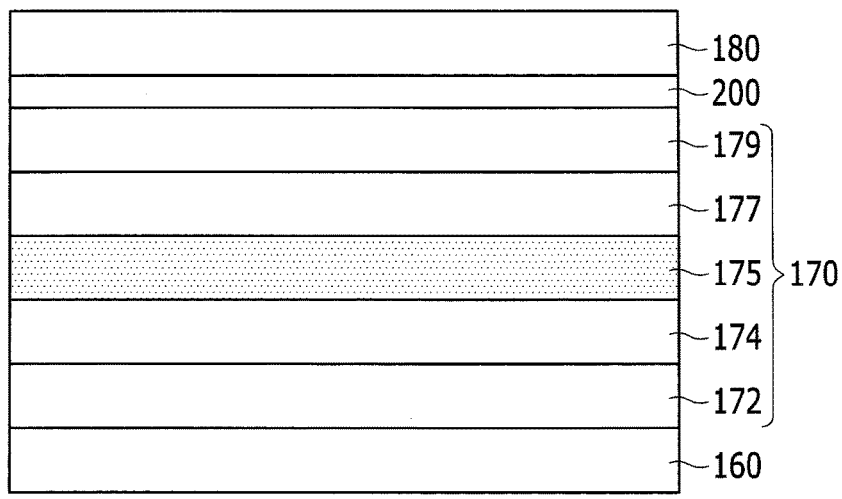
FIG. 3 is a cross-sectional view of a variation of the organic light emitting element of FIG. 1 according to an exemplary embodiment.

FIG. 3 is a cross-sectional view of a variation of the organic light emitting element of FIG. 1 according to an exemplary embodiment. The organic light emitting element according to the present exemplary embodiment is similar to the organic light emitting element described with reference to FIGS. 1 and 2, except for further including a hole injection layer 172 and an electron transporting layer 177.

Referring to FIG. 3, the hole transporting region of the organic light emitting element (e.g., a Light Diode "LD") described with reference to FIG. 1 further includes the hole injection layer 172, and also includes the electron transporting layer 177, which may be between the emission layer 175 and the electron injection layer 179. In the present exemplary embodiment, the hole injection layer 172 is between the hole transporting layer 174 and the first electrode 160. The hole injection layer 172 functions to inject the hole from the first electrode 160 to the hole transporting layer 174. In the present exemplary embodiment, the hole injection layer 172 may include a dipole material in which a metal or a non-metal having a work function of more than about 4.3 eV and a halogen are combined. However, the hole injection layer 172 is not limited thereto, and may be formed of other inorganic materials or organic materials.

The metal or the non-metal having the work function of more than about 4.3 eV may be an element selected from the group including Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, and/or Zn.

The electron transporting layer 177 is on the emission layer 175. The electron transporting layer 177 may transmit the electron from the second electrode 180 to the emission layer 175. Also, the electron transporting layer 177 may prevent the hole injected from the first electrode 160 from moving into the second electrode 180 through the emission layer 175. That is, the electron transporting layer 177 functions as a hole blocking layer, thereby helping the combination of the hole and the electron in the emission layer 175 (e.g., thereby increasing a combination rate of holes and electrons).

In this case, the electron transport layer 177 may include an organic material. For example, the electron transport layer 177 may be made of any one or more selected from a group consisting of Alq3 (tris(8-hydroxyquinolino)-aluminum), PBD, TAZ, spiro-PBD, BAlq, and/or SAlq, although the present invention is not limited thereto.

Next, emission efficiency and lifespan improvement of the organic light emitting element according to an exemplary embodiment of the present disclosure will be described.

In the organic light emitting element according to an exemplary embodiment of the present disclosure, the electron injection speed (e.g., a rate of injecting electrons) may be appropriately controlled by forming the barrier layer 200 between the electron injection layer 179 and the second electrode 180. This will be described in detail with reference to Table 1.

Table 1 shows the emission efficiency of the organic light emitting element when forming the barrier layer 200 between the electron injection layer 179 and the second electrode 180, according to an exemplary embodiment of the present disclosure, and the emission efficiency of the organic light emitting element when forming the electron injection layer 179 made of the halogen dipole material based on an alkali metal of the Group 1 metal, according to an exemplary embodiment of the present disclosure.

In Table 1, Comparative Example 2, Exemplary Embodiment 1, and Exemplary Embodiment 2 are cases of depositing an RbI layer as the electron injection layer 179 according to an exemplary embodiment of the present disclosure. Comparative Example 2 and Exemplary Embodiment 2 are cases of respectively forming a Mg single layer and an Ag single layer as the barrier layer 200 between the electron injection layer 179 and the second electrode 180. Comparative Example 1 and Exemplary Embodiment 1 are cases in which the barrier layer 200 is not included.

TABLE 1

|  | Efficiency (cd/A) |
| --- | --- |
| Comparative Example 1 (Yb/AgMg) | 46.0 |
| Comparative Example 2 (RbI/Mg/AgMg) | 48.8 |
| Exemplary Embodiment 1 (RbI/AgMg) | 48.9 |
| Exemplary Embodiment 2 (RbI/Ag/AgMg) | 48.6 |

In detail, as shown in Table 1, in Comparative Example 1, the electron injection layer 179 includes Yb and the second electrode 180 includes AgMg. Also, in Exemplary Embodiment 1, the electron injection layer 179 includes RbI, and the second electrode 180 includes AgMg. In Comparative Example 2, the electron injection layer 179 includes RbI, the barrier layer 200 includes Mg, and the second electrode 180 includes AgMg. In Exemplary Embodiment 2, the electron injection layer 179 includes RbI, the barrier layer 200 includes Ag, and the second electrode 180 includes AgMg.

Figure 4:
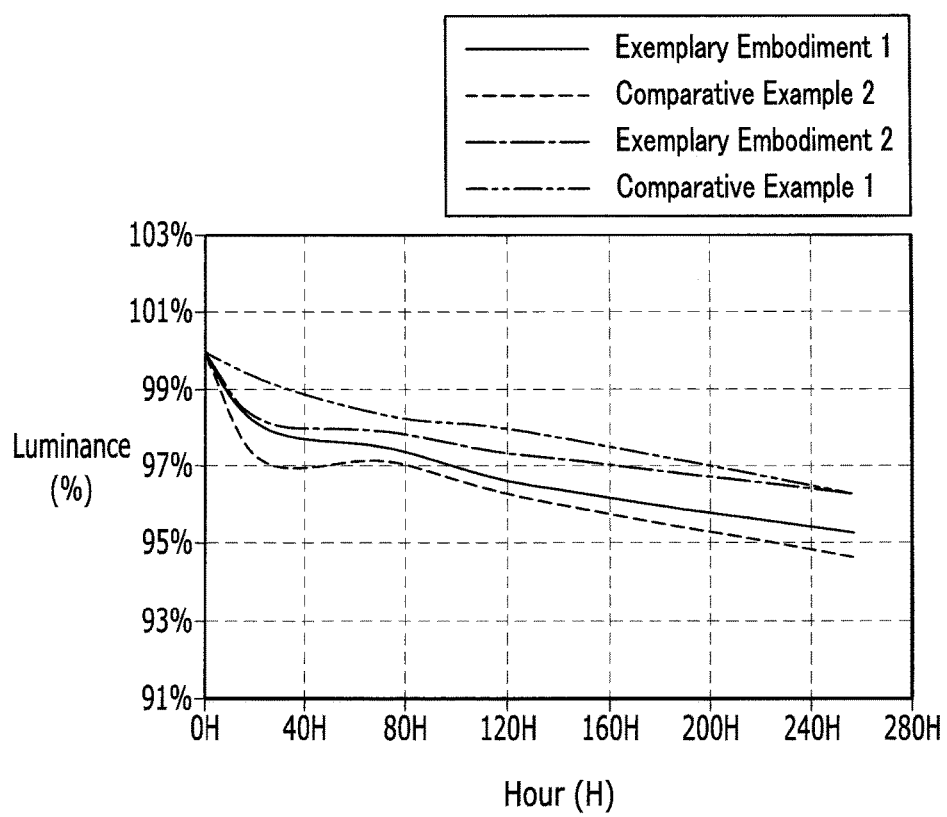
FIG. 4 is a graph showing a luminance change depending on time of an organic light emitting element according to a comparative example and according to an exemplary embodiment of the present disclosure.

FIG. 4 is a graph showing a luminance change depending on time of an organic light emitting element (e.g., an amount of time the organic light emitting element has been used) according to a comparative example and according to an exemplary embodiment of the present disclosure.

Referring to Table 1, it may be confirmed that the emission efficiency in Comparative Example 2, Exemplary Embodiment 1, and Exemplary Embodiment 2, in which the electron injection layer 179 includes the halogen dipole material based on rubidium (Rb) as the Group 1 metal, is high when compared with Comparative Example 1, in which the electron injection layer 179 includes ytterbium (Yb).

Next, referring to FIG. 4, the lifespan of the element depending on an existence of the barrier layer 200 will be described. When comparing Exemplary Embodiment 2 with the barrier layer 200 between the electron injection layer 179 and the second electrode 180, and Exemplary Embodiment 1, in which the barrier layer 200 is not included, it may be confirmed that the lifespan of the element of Exemplary Embodiment 1 is decreased when compared with Exemplary Embodiment 2.

Also, for Comparative Example 2 and Exemplary Embodiment 2 including the barrier layer 200, in the case of Exemplary Embodiment 2 including the barrier layer 200 made of the Ag single layer, which has a larger work function than the second electrode 180, it may be confirmed that the lifespan of the element is improved when compared with Comparative Example 2 including the barrier layer 200 formed of the Mg single layer, which has a smaller work function than the second electrode 180.

That is, according to an exemplary embodiment of the present disclosure, while maintaining the high emission efficiency by including the electron injection layer 179 including the halogen dipole material, the element lifespan may be improved by including the barrier layer 200 of the metal single layer having the higher work function than the second electrode 180 on the electron injection layer 179.

The barrier layer 200 according to an exemplary embodiment of the present disclosure may be deposited at an appropriate thickness to control the electron injection speed. In detail, as described above, the thickness of the barrier layer 200 may be about 10% of the thickness of the second electrode 180. The thickness of the barrier layer 200 according to an exemplary embodiment of the present disclosure may be less than or equal to about 5 nm, or may be less than or equal to about 2 nm.

This is described in detail with reference to Table 2.

TABLE 2

|  | Efficiency (cd/A) |
| --- | --- |
| Comparative Example 1 (Yb/AgMg) | 46.0 |
| Exemplary Embodiment 1 (RbI/AgMg) | 48.9 |
| Exemplary Embodiment 2 (RbI/Ag(0.5 nm)/AgMg) | 48.6 |
| Exemplary Embodiment 3 (RbI/Ag(1.0 nm)/AgMg) | 46.7 |
| Exemplary Embodiment 4 (RbI/Ag(nm 1.5)/AgMg) | 45.3 |

Referring to Table 2, in Exemplary Embodiment 2, Exemplary Embodiment 3, and Exemplary Embodiment 4, the electron injection layer 179 includes RbI, the barrier layer 200 includes an Ag single layer, and the second electrode 180 includes an AgMg alloy. In this case, the thickness of the barrier layer 200 in Exemplary Embodiment 2 is about 0.5 nm, the thickness of the barrier layer 200 in Exemplary Embodiment 3 is about 1.0 nm, and the thickness of the barrier layer 200 in Exemplary Embodiment 4 is about 1.5 nm.

In Exemplary Embodiments 2, 3, and 4, although the emission efficiency is decreased as the thickness of the barrier layer 200 is increased, sufficient emission efficiency appears when compared with the Comparative Example 1. Also, as seen in the graph showing the lifespan of the organic light emitting element of FIG. 4, the element lifespan is excellent compared with the efficiency.

Next, the organic light emitting diode display including the organic light emitting element according to an exemplary embodiment of the present disclosure will be described with reference to FIG. 5.

Figure 5:
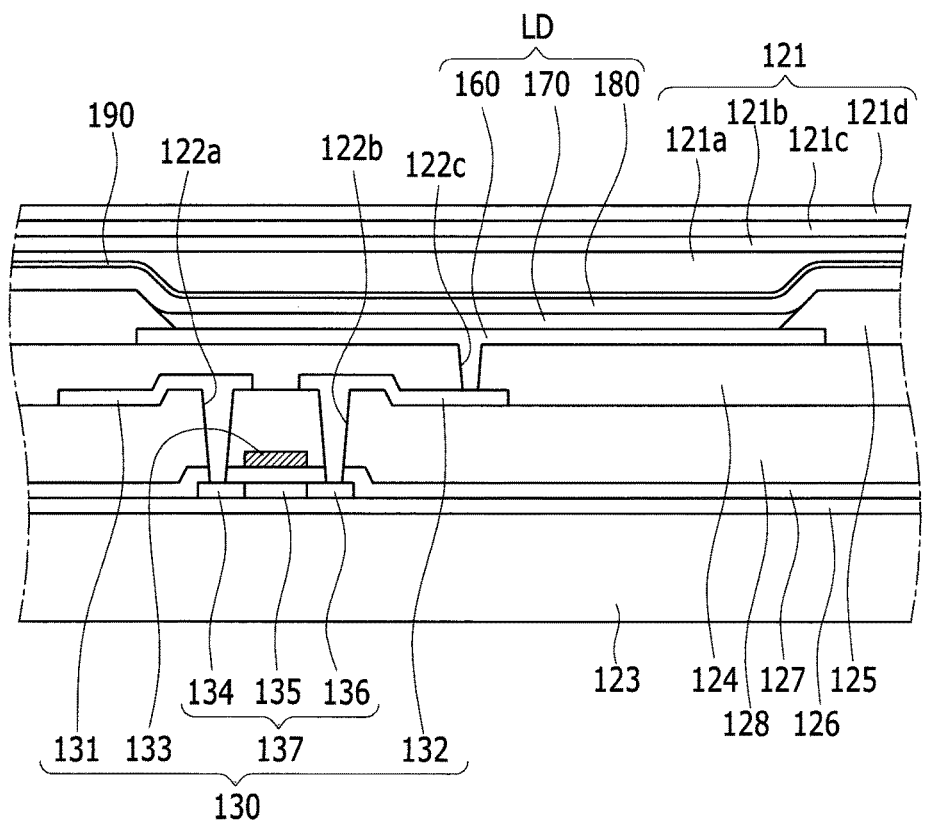
FIG. 5 is a cross-sectional view of an organic light emitting diode display according to an exemplary embodiment of the present disclosure.

FIG. 5 is a cross-sectional view of an organic light emitting diode display including an organic light emitting element LD region according to an exemplary embodiment of the present disclosure.

Here, a substrate 123 may be made of, for example, an inorganic material, such as glass, an organic material, such as a polycarbonate, polymethylmethacrylate, polyethylene terephthalate, polyethylene naphthalate, a polyamide, polyether sulfone, and/or a combination thereof, or a silicon wafer.

In addition, a substrate buffer layer 126 may be provided on the substrate 123. The substrate buffer layer 126 serves to prevent penetration of impure elements and planarize the surface. The substrate buffer layer 126 may be made of various materials capable of performing the functions. For example, one of a silicon nitride (SiNy) layer, a silicon oxide (SiOx) layer, and a silicon oxynitride (SiOxNy) layer may be used as the substrate buffer layer 126. However, in other embodiments, the substrate buffer layer 126 may be omitted according to a kind of substrate 123 and a process condition.

A driving semiconductor layer 137 is formed on the substrate buffer layer 126. The driving semiconductor layer 137 may be formed of a material including polysilicon. Further, the driving semiconductor layer 137 includes a channel region 135, in which impurities are not doped, and a source region 134 and a drain region 136, in which the impurities are doped at respective sides of the channel region 135. In this case, the doped ion materials may be P-type impurities, such as boron (B), and B2H6 may be mainly used. Here, the impurities may vary according to a kind of thin film transistor.

A gate insulating layer 127 made of a silicon nitride (SiNy) and/or a silicon oxide (SiOx) is formed on the driving semiconductor layer 137. A gate wire including a driving gate electrode 133 is formed on the gate insulating layer 127 to overlap at least a part of the driving semiconductor layer 137 (e.g., the channel region 135).

Meanwhile, an interlayer insulating layer 128 covering the driving gate electrode 133 is formed on the gate insulating layer 127. A first contact hole 122a and a second contact hole 122b that respectively expose the source region 134 and the drain region 136 of the driving semiconductor 137 are formed in the gate insulating layer 127 and in the interlayer insulating layer 128. Like the gate insulating layer 127, the interlayer insulating layer 128 may be made of a material, such as a silicon nitride (SiNy) and/or a silicon oxide (SiOx).

In addition, data wires including a driving source electrode 131 and a driving drain electrode 132 may be provided on the interlayer insulating layer 128. Further, the driving source electrode 131 and the driving drain electrode 132 are respectively connected with the source region 134 and the drain region 136 of the driving semiconductor layer 137 through the first contact hole 122a and the second contact hole 122b formed in the interlayer insulating layer 128 and in the gate insulating layer 127.

As described, a driving thin film transistor 130 including the driving semiconductor layer 137, the driving gate electrode 133, the driving source electrode 131, and the driving drain electrode 132 is formed. The configuration of the driving thin film transistor 130 is not limited to the aforementioned example, and may be variously modified.

In addition, a planarization layer 124 covering the data wires is formed on the interlayer insulating layer 128. The planarization layer 124 serves to remove/planarize a step to increase emission efficiency of the organic light emitting element to be formed thereon. Further, the planarization layer 124 has a third contact hole 122c exposing a part of the drain electrode 132. The planarization layer 124 may be made of one or more materials of a polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene (BCB).

An exemplary embodiment according to the present disclosure is not limited to the aforementioned structure, and in some cases, the planarization layer 124 and/or the interlayer insulating layer 128 may be omitted.

A first electrode of the organic light emitting element, that is, the pixel electrode 160, may be formed on the planarization layer 124. That is, the organic light emitting diode device includes a plurality of pixel electrodes 160 each respectively corresponding to one of the pixels. In this case, the pixel electrodes 160 are spaced apart from each other. The pixel electrode 160 is connected to the drain electrode 132 through the third contact hole 122c of the planarization layer 124.

Further, a pixel defining layer 125 having an opening that exposes the pixel electrode 160 is formed on the planarization layer 124. That is, the pixel defining layer 125 has a plurality of openings each formed for a respective pixel. In this case, a light-emitting element layer 170 may be formed for each opening of the pixel defining layer 125. Accordingly, a pixel area in which each light-emitting element layer 170 is formed may be defined by the pixel defining layer 125.

In this case, the pixel electrode 160 corresponds to the opening of the pixel defining layer 125. However, the pixel electrode 160 is not necessarily disposed only in the opening of the pixel defining layer 125, but may also be below the pixel defining layer 125, so that a part of the pixel electrode 160 is overlapped by the pixel defining layer 125, as shown in FIG. 5.

The pixel defining layer 125 may be made of a resin, such as a polyacrylate resin and a polyimide, a silica-based inorganic material, and/or the like.

The light-emitting element layer 170 is on the pixel electrode 160. The second electrode 180, that is, a common electrode 180, may be disposed on the light-emitting element layer 170. As described, an organic light emitting element LD including the pixel electrode 160, the light-emitting element layer 170, and the common electrode 180 is formed.

In this case, the pixel electrode 160 and the common electrode 180 may be made of a transparent conductive material or of a transflective or reflective conductive material. According to a type of materials of the pixel electrode 160 and the common electrode 180, the organic light emitting diode device may be a top emission type, a bottom emission type, or a double-sided emission type.

Meanwhile, an overcoat 190 covering and protecting the common electrode 180 may be formed as an organic layer on the common electrode 180.

In addition, a thin film encapsulation layer 121 is formed on the overcoat 190. The thin film encapsulation layer 121 encapsulates and protects both the organic light emitting element LD and a driving circuit part formed on the substrate 123 from the external environment.

The thin film encapsulation layer 121 may include organic encapsulation layers 121a and 121c, and inorganic encapsulation layers 121b and 121d, which are alternately laminated. In FIG. 5, for example, a case where two organic encapsulation layers 121a and 121c and two inorganic encapsulation layers 121b and 121d are alternately laminated to configure the thin film encapsulation layer 121 is illustrated, although the present invention is not limited thereto.

As described above, the display device including the organic light emitting element having the electron injection layer 179, the barrier layer 200, and the second electrode 180 according to an exemplary embodiment of the present disclosure improves lifespan while maintaining high emission efficiency.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims and their equivalents.

What is claimed is:

1. An organic light emitting element comprising:
   an anode as a first electrode;
   a cathode as a second electrode;
   an emission layer between the first electrode and the second electrode;
   an electron injection layer between the second electrode and the emission layer; and
   a barrier layer for controlling electron injection speed and for decreasing emission efficiency by slowing electron injection speed located between the electron injection layer and the second electrode, and having a work function that is larger than a work function of the second electrode,
   wherein a work function difference between the barrier layer and the second electrode is less than or equal to about 1.0 eV.

2. The organic light emitting element of claim 1, wherein the barrier layer comprises at least one selected from the group consisting of Ag, Al, Fe, In, Ti, Zn, Cr, Mn, Cu, Ga, Zr, Nb, Mo, Sn, Ta, W, Tl, Bi, Pb, and Sb.

3. The organic light emitting element of claim 2, wherein the second electrode comprises a single Ag layer, or comprises Ag and a metal having a work function of less than or equal to about 4.0 eV.

4. The organic light emitting element of claim 3, wherein, in the second electrode, a ratio of a volume occupied by Ag to a volume occupied by the metal having the work function of less than or equal to about 4.0 eV is in a range of about 10:1 to about 10:3.

5. The organic light emitting element of claim 4, wherein the second electrode comprises an AgMg alloy or an AgAl alloy.

6. The organic light emitting element of claim 3, wherein the second electrode comprises a plurality of layers respectively comprising the metal having the work function of less than or equal to about 4.0 eV and Ag.

7. The organic light emitting element of claim 3, wherein the electron injection layer comprises at least one selected from halogen dipole materials based on a Group 1 metal, a Group 2 metal, a transition metal, or a post-transition metal, or at least one selected from oxides based on the Group 1 metal, the Group 2 metal, the transition metal, or the post-transition metal.

8. The organic light emitting element of claim 7, wherein a thickness of the barrier layer is less than or equal to about 5 nm.

9. The organic light emitting element of claim 7, further comprising:
   an electron transport layer between the emission layer and the electron injection layer; and
   a hole transport layer between the first electrode and the emission layer.

10. An organic light emitting diode display comprising:
    a substrate;
    a thin film transistor on the substrate; and
    an organic light emitting element connected to the thin film transistor, and comprising:
    an anode as a first electrode;
    a cathode as a second electrode;

an emission layer between the first electrode and the second electrode;

an electron injection layer between the second electrode and the emission layer; and a barrier layer for controlling electron injection speed and for decreasing emission efficiency by slowing electron injection speed located between the electron injection layer and the second electrode, the barrier layer having a work function that is larger than a work function of the second electrode, wherein a work function difference between the barrier layer and the second electrode is less than or equal to about 1.0 eV.

11. The organic light emitting diode display of claim 10, wherein the barrier layer comprises at least one of Ag, Al, Fe, In, Ti, Zn, Cr, Mn, Cu, Ga, Zr, Nb, Mo, Sn, Ta, W, TI, Bi, Pb, and Sb.

12. The organic light emitting diode display of claim 11, wherein the second electrode comprises a single Ag layer, or Ag and a metal having a work function of less than or equal to about 4.0 eV.

13. The organic light emitting diode display of claim 12, wherein, in the second electrode, a ratio of volume occupied by Ag to a volume occupied by the metal having the work function of less than or equal to about 4.0 eV is in a range of about 10:1 to about 10:3.

14. The organic light emitting diode display of claim 13, wherein the second electrode comprises an AgMg alloy or an AgAl alloy.

15. The organic light emitting diode display of claim 12, wherein the second electrode comprises a plurality of layers respectively comprising at least one selected from the metal having the work function of less than or equal to about 4.0 eV and Ag.

16. The organic light emitting diode display of claim 12, wherein the electron injection layer comprises at least one selected from halogen dipole materials based on a Group 1 metal, a Group 2 metal, a transition metal, or a post-transition metal, or at least one selected from oxides based on the Group 1 metal, the Group 2 metal, the transition metal, or the post-transition metal.

17. The organic light emitting diode display of claim 16, wherein a thickness of the barrier layer is less than or equal to about 5 nm.

18. The organic light emitting diode display of claim 16, further comprising:

an electron transport layer between the emission layer and the electron injection layer; and a hole transport layer between the first electrode and the emission layer.

* * * * *